United States Patent
Hung

(10) Patent No.: US 9,973,212 B2
(45) Date of Patent: May 15, 2018

(54) DECODING ALGORITHM WITH ENHANCED PARITY CHECK MATRIX AND RE-ENCODING SCHEME FOR LDPC CODE

(71) Applicant: Storart Technology Co., Ltd., Hsinchu (TW)

(72) Inventor: Jui Hui Hung, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 8 days.

(21) Appl. No.: 14/847,214

(22) Filed: Sep. 8, 2015

(65) Prior Publication Data

US 2017/0070239 A1     Mar. 9, 2017

(51) Int. Cl.
*H03M 13/00*     (2006.01)
*H03M 13/11*     (2006.01)
*H03M 13/37*     (2006.01)

(52) U.S. Cl.
CPC ...... *H03M 13/1108* (2013.01); *H03M 13/116* (2013.01); *H03M 13/1185* (2013.01); *H03M 13/3776* (2013.01); *H03M 13/6502* (2013.01); *H03M 13/6544* (2013.01)

(58) Field of Classification Search
CPC ........... H03M 13/1108; H03M 13/616; H03M 13/2906; H03M 13/152; G06F 11/10
See application file for complete search history.

(56) References Cited

U.S. PATENT DOCUMENTS

| | | | | |
|---|---|---|---|---|
| 7,454,685 B2* | 11/2008 | Kim | ................... | H03M 13/1114 714/758 |
| 7,519,898 B2* | 4/2009 | Narayanan | ......... | H03M 13/1191 714/755 |
| 7,607,063 B2* | 10/2009 | Kikuchi | ................. | G11B 20/18 714/752 |
| 8,074,156 B2* | 12/2011 | Yokokawa | ........ | H03M 13/1515 714/794 |
| 8,489,962 B2* | 7/2013 | Dielissen | ........... | H03M 13/1114 714/758 |
| 8,751,895 B2* | 6/2014 | Obata | ................... | H03M 13/112 375/262 |
| 8,898,537 B2* | 11/2014 | Gross | ................. | H03M 13/1111 714/758 |
| 9,191,256 B2* | 11/2015 | Vojcic | ..................... | H04L 1/005 |
| 9,235,467 B2* | 1/2016 | Micheloni | ........... | G06F 11/1012 |
| 9,281,902 B2* | 3/2016 | Liboiron-Ladouceur | ........... | H04B 10/616 |

* cited by examiner

*Primary Examiner* — Esaw T Abraham
(74) *Attorney, Agent, or Firm* — Che-Yang Chen; Law Offices of Scott Warmuth

(57) ABSTRACT

A decoding algorithm with an enhanced parity check matrix and a re-encoding scheme for LDPC codes is disclosed. The decoding algorithm includes the steps of: providing the enhanced parity check matrix; receiving a message part of an original codeword encoded by a generator matrix from the enhanced parity check matrix; setting a LLR for each bit node of the enhanced parity check matrix; processing hard decision on the message part of the original codeword; encoding the message part of the original codeword by the generator matrix to generate a new codeword having a generated parity part; comparing the original parity part with the generated parity part to find out bits of difference; voting candidate error bits to choose the most probably erratic bits; modifying LLR of the chosen bits to have a modified codeword; and processing a conventional iterative decoding procedure on the modified codeword to have a processed codeword.

7 Claims, 6 Drawing Sheets

| Location of Different Bits Found | | | Situation of Error of Bits |
|---|---|---|---|
| $m^{th}$ | $(m+1)^{th}$ | $(m+2)^{th}$ | |
| 0 | 0 | 0 | No Message Bit in the $m^{th}$ Row of the Row Group Might Be Error |
| 0 | 0 | 1 | Unknown |
| 0 | 1 | 0 | $(m+1)^{th}$ Parity Bit in the Group Might Be Error |
| 0 | 1 | 1 | There Might Be a Message Bit Error in the $m^{th}$ Row of the Row Group |

Fig. 6

DECODING ALGORITHM WITH ENHANCED PARITY CHECK MATRIX AND RE-ENCODING SCHEME FOR LDPC CODE

FIELD OF THE INVENTION

The present invention relates to a decoding algorithm for LDPC codes. More particularly, the present invention relates to a decoding algorithm with an enhanced parity check matrix and a re-encoding scheme for LDPC codes.

BACKGROUND OF THE INVENTION

Low-density parity check (LDPC) code can achieve performance close to Shannon bound. Therefore, LDPC has been adopted by many state-of-the-art communication systems. It is a kind of binary linear block code whose parity check matrix is sparse which has much fewer 1s than a commonly used one. A sparse parity check matrix facilitates simple decoding algorithms and low-complexity decoder designs. Check matrix of a LDPC code is often represented by a bipartite graph, called Tanner graph, which is composed of n bit nodes (realized by Bit Node Units, BNU) and m check nodes (realized by Check Nodes Unit, CNUs). Those bit nodes and check nodes are connected by edges defined by the nonzero entries of the parity check matrix H. The number of "1" in each column of H determines the number of edges for each bit node connected to check nodes, and the number of "1" in each row of H determines the connections from each check node to bit nodes. Tanner graph shows a clear picture of all the information of exchange links in a decoding process. Although LDPC code has excellent decoding performance, its high computation complexity makes the area costs of LDPC decoders much larger than other ECC decoders. Besides, as the code length of adopted LDPC code increases, the area of Barrier Synchronization Register (BSR) array occupied in the whole LDPC decoder will significantly raise.

LDPC codes have advantages of better block error performance and parallelizable decoding processes over Turbo codes. Hence, it can potentially achieve significantly greater speeds and higher throughputs than Turbo codes. Parallelizable decoding processes can make LDPC code be decoded in a short time. LDPC code is a kind of binary linear block code which means it has to wait to receive the whole codeword before the LDPC code decoding processes begin. Due to the reasons mentioned above, the longer LDPC codeword is, the longer time it has to spend to receive the whole codeword. Thus, the decoding latency would be increased. There is not suitable prior art discussing solutions for this issue.

Therefore, the present invention provides an efficient method that can modify the LLR of bit nodes before the whole LDPC codeword is received to let the decoding iteration of LDPC code decreased, further achieving the goal of shorten the decoding latency.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to fulfill the requirement above, a decoding algorithm with an enhanced parity check matrix and a re-encoding scheme for LDPC codes is provided. The decoding algorithm includes the steps of: A. providing the enhanced parity check matrix is formed by a plurality of sub-matrixes where a first identity matrix in a specific location; B. receiving a message part of an original codeword encoded by a generator matrix from the enhanced parity check matrix with at least one bit is corrupted; C. setting a Log-Likelihood Ratio (LLR) for each bit node of the enhanced parity check matrix while keeping receiving an original parity part of the original codeword; D. processing hard decision on the message part of the original codeword; E. encoding the message part of the original codeword by the generator matrix to generate a new codeword having a generated parity part; F. comparing the original parity part with the generated parity part to find out bits of difference; G. voting candidate error bits to choose the most probably erratic bits; H. modifying LLR of the chosen bits to have a modified codeword; and I. processing a conventional iterative decoding procedure on the modified codeword to have a processed codeword.

The decoding algorithm further includes steps after step I: J. judging if a preset number of iteration is reached or a product of the enhanced parity check matrix and the processed codeword equals zero; and if a result of step J is "no", repeating the procedure from step D with the processed codeword; if the result of step J is "yes", outputting a message part of the processed codeword.

The enhanced parity check matrix, $H_{enhanced}$, should have a form of $H_{enhanced}=[H_1|H_2]$. Each sub-matrix is a zero matrix, an identity matrix or a shifted matrix which has all 1 s in an identity matrix shifted to the right side a certain times. Arrangement of identity matrixes in $H_2$ is a dual-diagonal structure. A first column of sub-matrixes in $H_2$ is close to $H_1$. A first sub-matrix located first from the top of the first column and a last sub-matrix located last from the top of the first column are both identity matrixes or shifted matrixes. Sub-matrixes between the first sub-matrix and the last sub-matrix are zero matrixes and the first identity matrix. The first identity matrix is located closer to the last sub-matrix than the first sub-matrix.

The LLR for each bit node is available by $$LLR = \frac{2}{\sigma^2} y_k,$$

where $y_k$ is received signal of any one bit in the message part of the original codeword and $\sigma$ is variance of all received signals; k is any integer. A voting means works for voting candidate error bits. The LLR is modified by changing magnitude thereof or sign. The conventional iterative decoding procedure is Sun-Product Algorithm (SPA).

The present invention takes advantages of the enhanced parity check matrix and re-encoding scheme, possible errors can be soon flipped. Thus, the number of iteration of SPA can be reduced. It means time to have correct message can be shorter than current algorithms. High performance and high throughput of a LDPC decoder can be available.

BRIEF DESCRIPTION OF THE DRAWINGS

FIG. 2 shows a 960×480 parity check matrix used as an IEEE 802.16e standard.

FIG. 3 shows differences between an identity matrix and a shifted matrix.

FIG. 4 shows a 960×480 enhanced parity check matrix used by the present invention.

FIG. 6 is a table about location of different bits found and associated situation of error of bits.

DETAILED DESCRIPTION OF THE PREFERRED EMBODIMENTS

The present invention will now be described more specifically with reference to the following embodiments.

Figure 1:
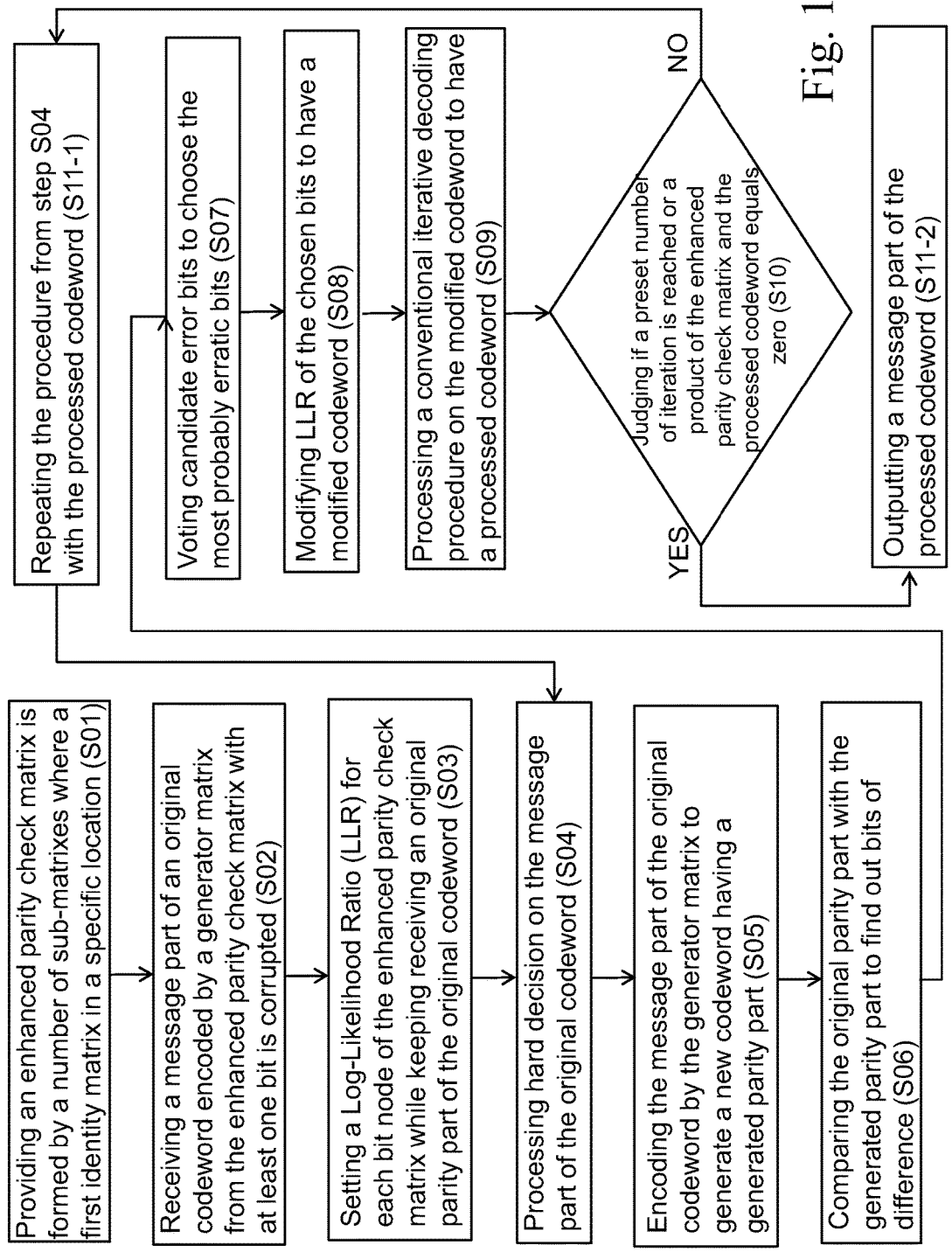
FIG. 1 is a flow chart of a decoding algorithm for LDPC codes disclosed by the present invention.

Please refer to FIG. 1. FIG. 1 is a flow chart of a decoding algorithm for LDPC codes with an enhanced parity check matrix and a re-encoding scheme disclosed by the present invention. The basic concept of the proposed algorithm is very simple. The parity bits are generated from message bits. So they contain the information about the message bits. If a codeword transmit through AWGN (Additive White Gaussian Noise) channel, it could be incorrect because of the noise. Since noise is independent, errors of the message bits are not associated with the errors of the parity bits. Hence, if we regenerate the parities with the received message bits, the regenerated parities will contain the information of error message bits, but not the information of error parity bits. The received parities will only contain the information of error parity bits. Therefore, we can compare them to find out the errors and correct them.

Figure 2:
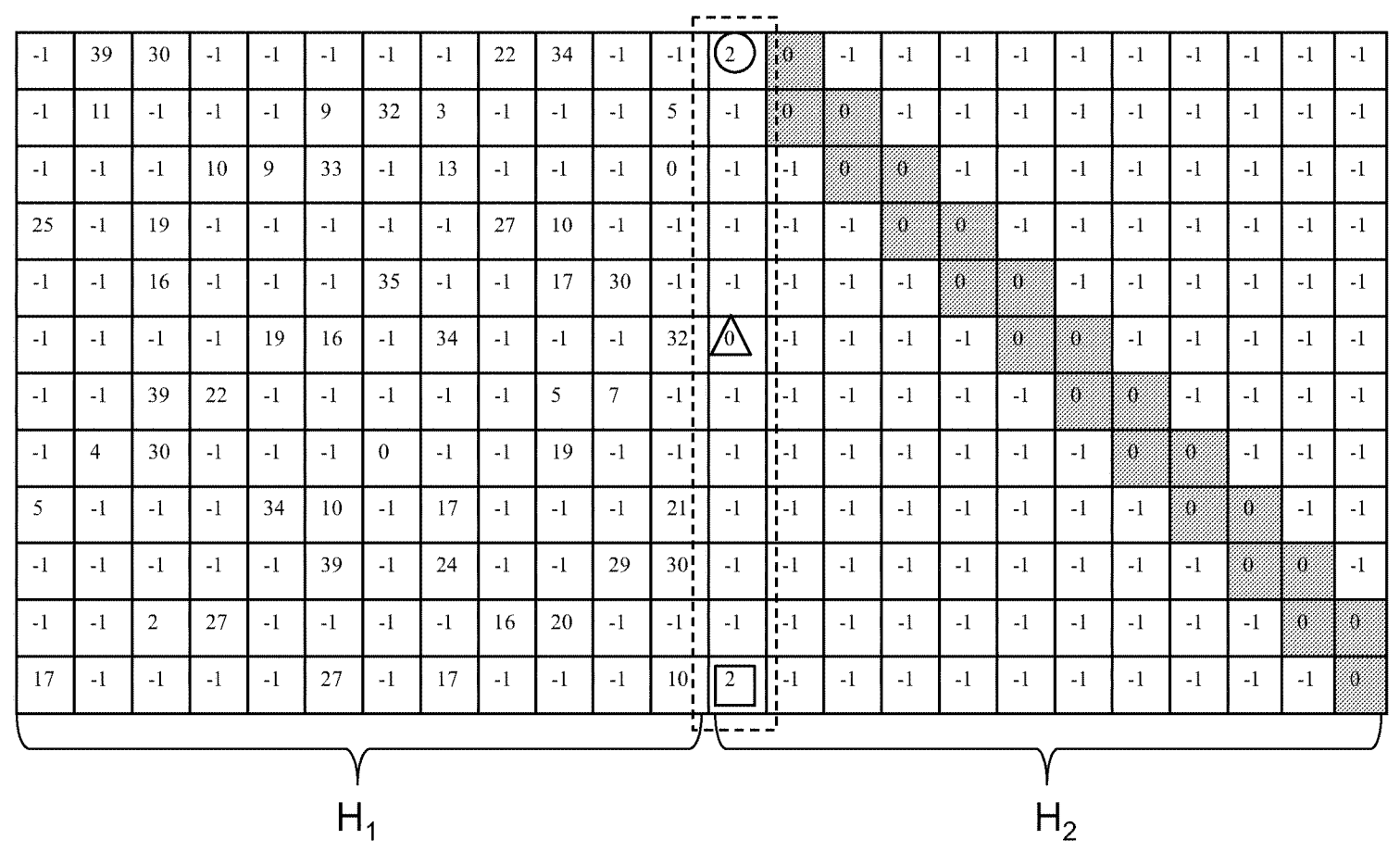
Figure 3:
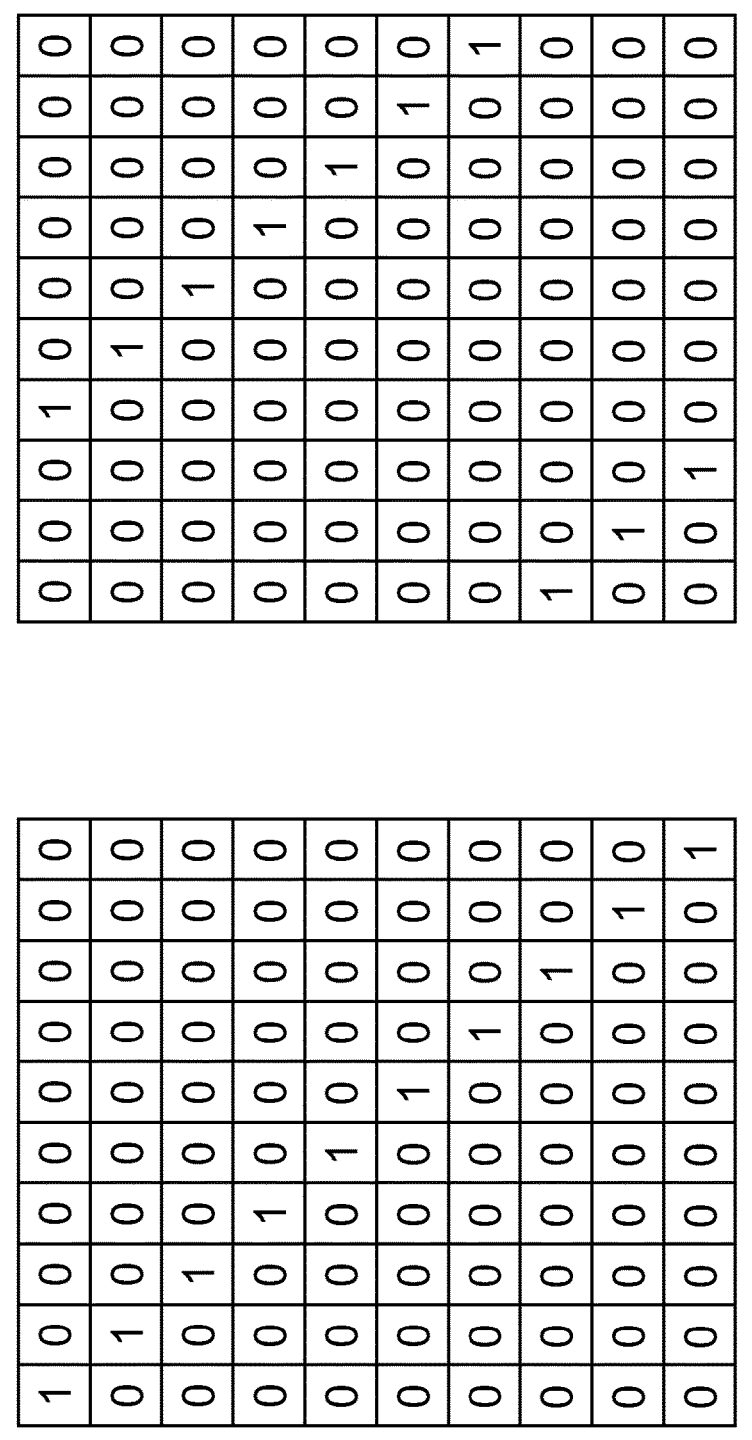

According to the present invention, the first step is to provide the enhanced parity check matrix ($H_{enhanced}$ will be used to illustrate the enhanced parity check matrix in any equation hereinafter) mentioned above which is formed by a number of sub-matrixes. Among these sub-matrixes, a first identity matrix is in a specific location (S01). In order to have better understanding about the enhanced parity check matrix, please refer to FIG. 2. FIG. 2 shows a 960×480 parity check matrix, $H_{16e}$, used as an IEEE 802.16e standard. The $H_{16e}$ is composed of two portions. It can be illustrated as $H_{16e} = [H_1|H_2]$. $H_{enhanced}$ and $H_{16e}$ are alike in structure. Thus, $H_{16e}$ is composed of a number of sub-matrixes. Each sub-matrix can be a zero matrix, an identity matrix or a shifted matrix. The shifted matrix has all 1 s in an identity matrix shifted to the right side a certain times. Please see FIG. 3. FIG. 3 shows differences between an identity matrix and a shifted matrix. On the left side of FIG. 3 is a 10×10 identity matrix. If all 1 s in the identity matrix are shifted to the right side (column) three times, we will get the shifted matrix on the right side of FIG. 3. Come back to FIG. 2. In order to know how many times the shifted matrixes shift and where the sub-matrixes are zero matrixes, a notation is used. Numbers are marked in each frame in the $H_{16e}$. Each frame refers to a corresponding sub-matrix. If the number is "0", the sub-matrix is an identity matrix. If the number is "−1", the sub-matrix is a zero matrix. If the number is a positive integer, the positive integer is the number all 1 s an identity matrix shifted to the right side. Because the size of the sub-matrix is 40×40 in this case, the maximal positive integer is 39.

Figure 4:
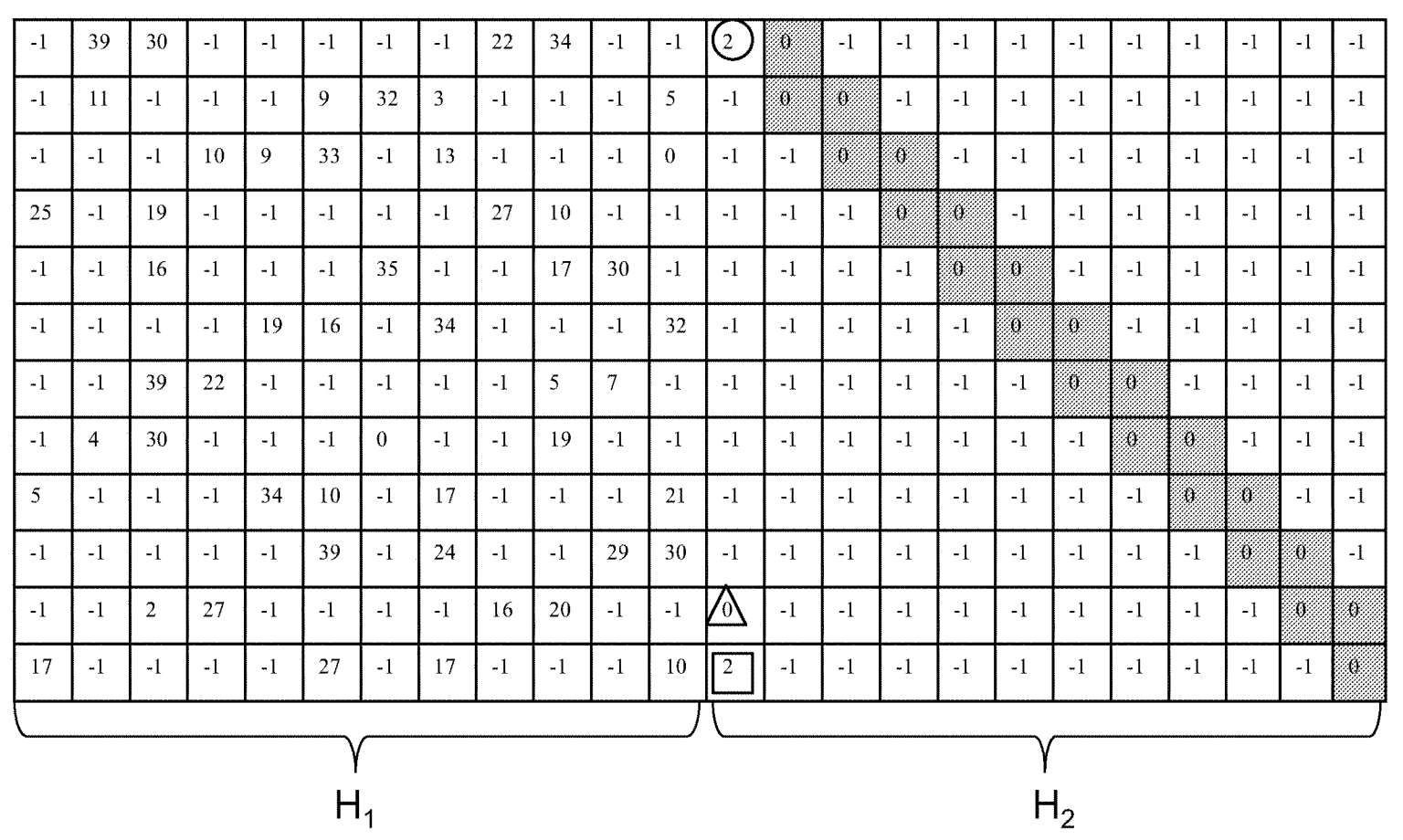

Arrangement of identity matrixes in $H_2$ is a dual-diagonal structure. As marked in a darker background color, the identity matrixes forms two diagonals from top left to bottom right. A first column of sub-matrixes (enclosed by a dashed frame) is close to $H_1$. A first sub-matrix is located first from the top of the first column. In FIG. 2, the first sub-matrix is a shifted matrix with all 1 s shifted to right side twice (the positive integer is 2 in the frame representing the first sub-matrix and enclosed by a circle). A last sub-matrix is located last from the top of the first column. The last sub-matrix is also a shifted matrix with all 1s shifted to right side twice (the positive integer is 2 in the frame representing the last sub-matrix and enclosed by a square). The first sub-matrix and the last sub-matrix are both identity matrixes or both shifted matrixes. Sub-matrixes between the first sub-matrix and the last sub-matrix are zero matrixes and the first identity matrix. For $H_{16e}$, the first identity matrix is located in the 6$^{th}$ sub-matrix location from the top of the first column. According to the present invention, the difference between the $H_{16e}$ and the $H_{enhanced}$ is that the first identity matrix of the $H_{enhanced}$ is located closer to the last sub-matrix than the first sub-matrix. Preferably, the first identity matrix of the $H_{enhanced}$ is just located next to the last sub-matrix as shown in FIG. 4. By simulation, the closer the first identity matrix is located from the last sub-matrix, the easier the error bits can be chosen in the following steps.

Next, receive a message part of an original codeword which was encoded by a generator matrix from the enhanced parity check matrix. (S02). In step S02, the received original codeword has at least one bit is corrupted due to noise in the channel it was transmitted. It should noticed that for the original codeword, the corrupted bits (or error bits) may in the message part, in an original parity part ("original" used here is to distinguish from other parity part illustrated later) received later or both in the message part and the original parity part. The decoding algorithm takes all situations into consideration, not only the error bits in the message part.

Then, set a Log-Likelihood Ratio (LLR) for each bit node of the enhanced parity check matrix while keeping receiving the original parity part of the original codeword (S03). The LLR for each bit node is available by $$LLR = \frac{2}{\sigma^2} y_k,$$

where $y_k$ is received signal of any one bit in the message part of the original codeword and $\sigma$ is variance of all received signals. Numeral k can be any positive integer. In the example of original codeword, k is 480 since there is 480 message bits in the original codeword. Next, process hard decision on the message part of the original codeword (S04). It means the message bits are confirmed now although they might be wrong after transmitting.

In a step S05, encode the message part of the original codeword by the generator matrix to generate a new codeword which has a generated parity part. Now, there are two parity parts available, the original parity part and the generated parity part. Then, compare the original parity part with the generated parity part to find out bits of difference (S06).

In a next step, vote candidate error bits to choose the most probably erratic bits (S07). A voting means works for voting candidate error bits. Before the voting means is introduced, a grouping operation should be done to the $H_{enhanced}$. Take FIG. 4 for example. The grouping operation can be separated into two parts, grouping the rows of bits and grouping the parity bits. For grouping the rows of bits, first, take the first row of each sub-matrix row. Then we can get 12 rows of bits. They are the 1$^{st}$, 41$^{st}$, 81$^{st}$, 121$^{st}$, 161$^{st}$, 201$^{st}$, 241$^{st}$, 281$^{st}$, 321$^{st}$, 361$^{st}$, 401$^{st}$ and 441$^{st}$ rows of bits in the $H_{enhanced}$. Then, group the rows of bits as a first row group, $G_1^r$. Next, take the second row of each sub-matrix row. 12 rows of bits will be available. They are the 2$^{nd}$, 42$^{nd}$, 82$^{nd}$, 122$^{nd}$, 162$^{nd}$, $202^{nd}$, $242^{nd}$, $282^{nd}$, $322^{nd}$ $362^{nd}$, $402^{nd}$ and $442^{nd}$ rows of bits in the $H_{enhanced}$. Group the rows of bits as a second row group, $G_2^r$. Keep grouping the rows of bits and 40 row groups are obtained. Let $G_i^r$ where i=1, 2, . . . or 40 representing each row group and the $i^{th}$ group contains the $(i+n \times b)^{th}$ row, where n is an integer from 0 to 11 and b is the sub-matrix size of 40. Name the $i^{th}$ row of bits as the first row in the $i^{th}$ row group, $G_i^r$, and the $(40+i)^{th}$ row of bits is the second row in $G_i^r$, and so on. The $(i+j \times b)^{th}$ row is the $j^{th}$ row in $G_i^r$.

Figure 5:
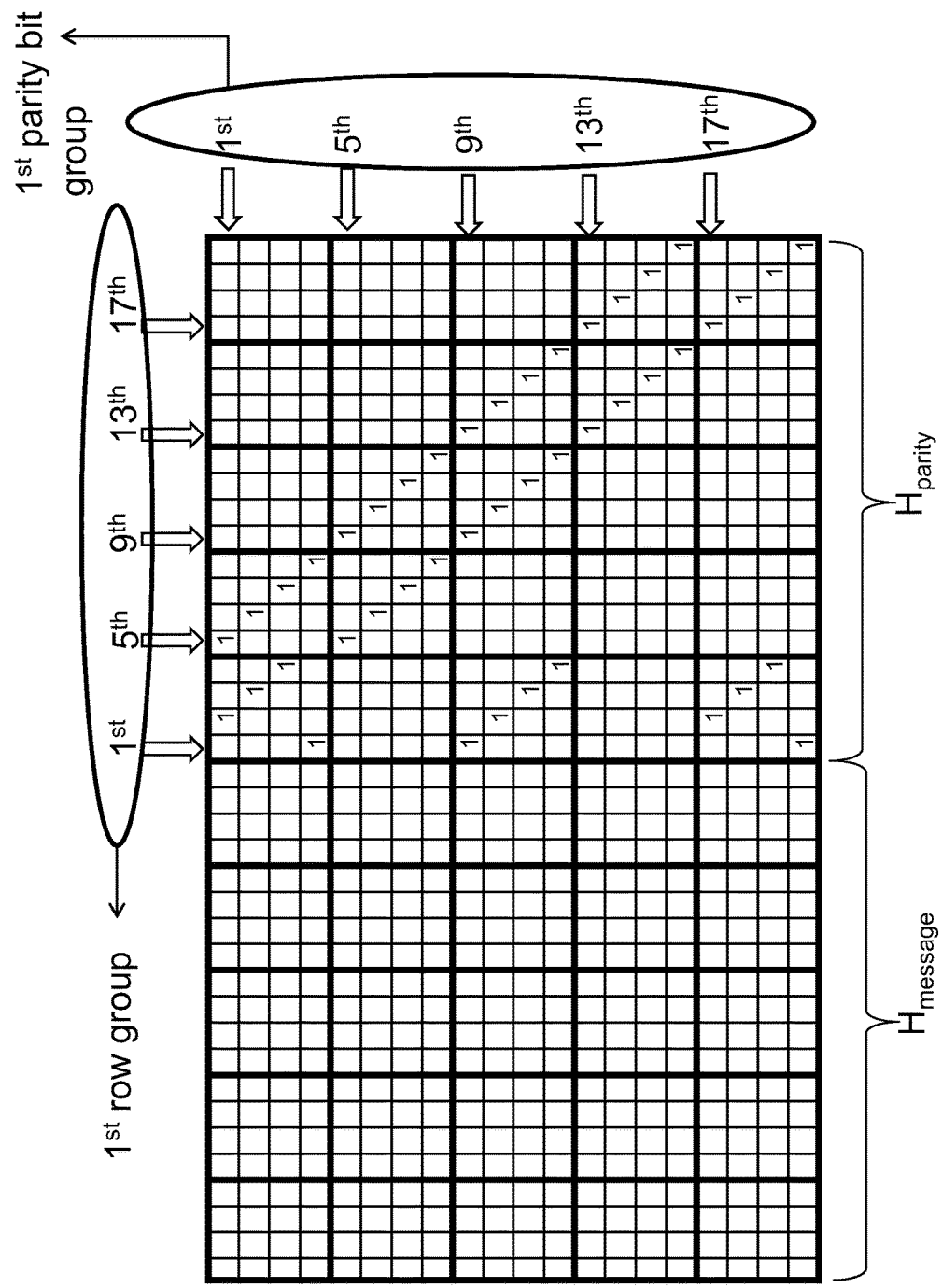
FIG. 5 shows an example of grouping the rows of bits and the parity bits of a parity check matrix for (40,20) LDPC codes.

For grouping the parity bits, first, group the $(1+n \times b)^{th}$ column of parity bits of the $H_{enhanced}$ as a first parity bit group $G_1^p$. Secondly, group the $(2+n \times b)^{th}$ column of parity bits of the $H_{enhanced}$ as a second parity bit group. Keep grouping until all columns are grouped in one of the parity bit group. There are 40 parity bit groups of parity bits, $G_i^p$, obtained where i=1, 2, . . . 40. The $i^{th}$ parity bit group, $G_i^p$, contains the $(1+n \times b)^{th}$ parity bits, where n is an integer from 0 to 11. The $i^{th}$ parity bit in one row is the first bit in the row of the $i^{th}$ parity bit group, the $(40+i)^{th}$ parity bit in one row is the second bit in the row of the $i^{th}$ parity bit group, and so on. The $(i+j \times b)^{th}$ parity bit in one row is the $j^{th}$ bit in the row of the $i^{th}$ parity bit group. FIG. 5 shows an example of grouping the rows of bits and the parity bits of a parity check matrix for (40,20) LDPC codes. It should be noticed that in the message part, $H_{message}$, the arrangement of bits of 1 or 0 are not shown. However, in the parity part, $H_{parity}$, a frame with 1 inside represents a bit of 1 in that location while a frame with nothing inside represents a bit of 0 in that location. In the each parity bit group, any difference (bit) between the received bits in the parity part and the bits in generated parity part correspond to the row that has a bit of 1.

Come back to step S07. After the bits in the enhanced parity check matrix are grouped according to what have been discussed above, based on computing and simulating, the voting means can be found that can recognize which bits are probable errors and votes are done. As receiving the original parity part of the original codeword, the generated parity bits and the received original parity bits can be compared. Potential error bits can be located according to FIG. 6. It is a table about location of different bits found and associated situation of error of bits.

In FIG. 6, if the $m^{th}$ generated parity bit is the same as the $m^{th}$ original parity bit, and the $(m+1)^{th}$ and the $(m+2)^{th}$ generated parity bits are also the same as the original parity bits (0 in each field shows two corresponding bits are the same and 1 in each field shows two corresponding bits are different) in corresponding locations, it is confirmed that there might be no message bit error in the original codeword in the $m^{th}$ row of the row group. It should be noticed that, for the condition that errors occurred, location of the error bits correspond to 1s in a specific row of the row group. If the $m^{th}$ generated parity bit is the same as the $m^{th}$ original parity bit, the $(m+1)^{th}$ generated parity bit is also the same as the $(m+1)^{th}$ original parity bit, but the $(m+2)^{th}$ generated parity bit is different from the $(m+2)^{th}$ original parity bit, it is not able to know which bit is error now. If the $m^{th}$ and the $(m+2)^{th}$ generated parity bits are the same as the $m^{th}$ and the $(m+2)^{th}$ original parity bit, but the $(m+1)^{th}$ generated parity bit is different from the $(m+1)^{th}$ original parity bit, it means the $(m+1)^{th}$ parity bit corresponding to 1 in the row group might be error. And if the $m^{th}$ generated parity bit is the same as the $m^{th}$ original parity bit, but the $(m+1)^{th}$ and $(m+2)^{th}$ generated parity bits are different from the $(m+1)^{th}$ and $(m+2)^{th}$ original parity bits, respectively, it means there might be a message bit error corresponding to 1 in the $m^{th}$ row of the row group.

Although it is able to tell that the errors might be in which row, it is not known that the errors exactly locate in which bit. For example, if it is known that there is an error in the first row of the first row group, it means the $80^{th}$, $111^{st}$, $183^{th}$, $254^{th}$ message bits might be errors. But if it is also known that there is an error in the second row of the 29th row group, that means the $80^{th}$, $239^{st}$, $262^{th}$, $413^{th}$ message bits might be errors. Concluding all the information above, we can know that the $80^{th}$ bit is most likely being erratic. So the voting means applies voting scheme to the candidate error bits and pick the most likely error bits. If there is a message bit error in the $m^{th}$ row, it is voted one to a count of the bits which are on the position of 1 in the row. If there is no message bit error in the $m^{th}$ row, one is deducted from the voting count to the bits which are on the position of 1 in the row. After voting, since it is assumed that every row has at most one 1 corresponding to the bit error, a bit has the most votes in the row is chosen as the most likely error bit. Collect all most likely error bits in the row group. Because the row weight of the parity matrix is 4 or 5, the average number of error bits in a row is less than 0.5 if SNR is above 2.

The next step is to modify LLR of the chosen bits to have a modified codeword (S08). The LLR may be modified by changing its magnitude or sign. It is not limited by the present invention. Now, some bits in the modified codeword are flipped. Then, process a conventional iterative decoding procedure on the modified codeword to have a processed codeword (S09). In the present embodiment, the conventional iterative decoding procedure is Sun-Product Algorithm (SPA). From step S01 to step S08, the modified codeword is more "correct" with some bits changed for SPA. Therefore, the number of iteration of the SPA can be reduced.

According to the spirit of the present invention, further steps can be applied after S09. First, judge if a preset number of iteration is reached or a product of the enhanced parity check matrix and the processed codeword equals zero (S10). It is to make sure if the iteration can be stopped. If a result of step S10 is "no", repeat the procedure from step S04 with the processed codeword (S11-1); if the result of step S10 is "yes", output a message part of the processed codeword (S11-2).

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A computer-implemented method of decoding a Low Density Parity Check (LDPC) code with an enhanced parity check matrix and a re-encoding scheme to decrease decoding iteration of the LDPC code and shorten decoding latency, comprising the steps of:
   A. providing the enhanced parity check matrix which is formed by a plurality of sub-matrixes, wherein a first identity matrix in a specific location;
   B. receiving a message part of an original codeword encoded by a generator matrix from the enhanced parity check matrix with at least one bit is corrupted;

C. setting a Log-Likelihood Ratio (LLR) for each bit node of the enhanced parity check matrix while keeping receiving an original parity part of the original codeword;
D. processing hard decision on the message part of the original codeword;
E. encoding the message part of the original codeword by the generator matrix to generate a new codeword having a generated parity part;
F. comparing the original parity part with the generated parity part to find out bits of difference;
G. voting candidate error bits to choose the most probably erratic bits;
H. modifying LLR of the chosen bits to have a modified codeword; and
I. processing a conventional iterative decoding procedure on the modified codeword to have a processed codeword, wherein the enhanced parity check matrix, $H_{enhanced}$, has a form of $H_{enhanced}=[H_1|H_2]$, wherein each sub-matrix is a zero matrix, an identity matrix or a shifted matrix which has all 1s in an identity matrix shifted to the right side a certain times; arrangement of identity matrixes in $H_2$ is a dual-diagonal structure; a first column of sub-matrixes in $H_2$ is close to $H_1$; a first sub-matrix located first from the top of the first column and a last sub-matrix located last from the top of the first column are both identity matrixes or shifted matrixes; sub-matrixes between the first sub-matrix and the last sub-matrix are zero matrixes and the first identity matrix; the first identity matrix is located closer to the last sub-matrix than the first sub-matrix.

2. The computer-implemented method according to claim 1, further comprising the steps of, after step I:
J. judging if a preset number of iteration is reached or a product of the enhanced parity check matrix and the processed codeword equals zero; and
K. if a result of step J is "no", repeating the procedure from step D with the processed codeword; if the result of step J is "yes", outputting a message part of the processed codeword.

3. The computer-implemented method according to claim 1, wherein the first identity matrix is located next to the last sub-matrix.

4. The computer-implemented method according to claim 1, wherein the LLR for each bit node is available by $$LLR = \frac{2}{\sigma^2} y_k,$$

where $y_k$ is received signal of any one bit in the message part of the original codeword and $\sigma$ is variance of all received signals; k is any integer.

5. The computer-implemented method according to claim 1, wherein a voting means works for voting candidate error bits.

6. The computer-implemented method according to claim 1, wherein the LLR is modified by changing magnitude thereof or sign.

7. The computer-implemented method according to claim 1, wherein the conventional iterative decoding procedure is Sun-Product Algorithm (SPA).

* * * * *